United States Patent
Hoshino et al.

(10) Patent No.: US 9,541,623 B2
(45) Date of Patent: Jan. 10, 2017

(54) MAGNETIC RESONANCE IMAGING APPARATUS AND FLIP ANGLE DETERMINATION METHOD

(75) Inventors: Yusuke Hoshino, Tokyo (JP); Akiko Kaneta, Tokyo (JP); Shinji Kurokawa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 494 days.

(21) Appl. No.: 14/116,228

(22) PCT Filed: May 23, 2012

(86) PCT No.: PCT/JP2012/063118
§ 371 (c)(1),
(2), (4) Date: Nov. 7, 2013

(87) PCT Pub. No.: WO2012/169350
PCT Pub. Date: Dec. 13, 2012

(65) Prior Publication Data
US 2014/0077805 A1    Mar. 20, 2014

(30) Foreign Application Priority Data
Jun. 9, 2011 (JP) .................. 2011-129480

(51) Int. Cl.
*G01V 3/00* (2006.01)
*G01R 33/56* (2006.01)
(Continued)

(52) U.S. Cl.
CPC .......... *G01R 33/56* (2013.01); *G01R 33/5617* (2013.01); *G01R 33/583* (2013.01)

(58) Field of Classification Search
CPC ... G01R 33/3415; G01R 33/36; G01R 33/543; G01R 33/3692; A61B 5/055
(Continued)

(56) References Cited

U.S. PATENT DOCUMENTS

| | | | | |
|---|---|---|---|---|
| 5,704,357 A | * | 1/1998 | Miyazaki | G01R 33/5617 324/307 |
| 2005/0001617 A1 | * | 1/2005 | Busse | G01R 33/5613 324/307 |

(Continued)

FOREIGN PATENT DOCUMENTS

| | | |
|---|---|---|
| JP | 7-323016 | 12/1995 |
| JP | 2005-21690 | 1/2005 |

OTHER PUBLICATIONS

International Search Report in PCT/JP2012/063118.
(Continued)

*Primary Examiner* — Walter L Lindsay, Jr.
*Assistant Examiner* — Frederick Wenderoth
(74) *Attorney, Agent, or Firm* — Cooper & Dunham LLP

(57) ABSTRACT

The purpose of the present invention is to obtain an image with a desired contrast while minimizing specific absorption rate and without deteriorating image quality in a variable refocus flip angle sequence. To this end, Teequiv specified by a signal decay pattern SSP obtained by a flip angle changing pattern FAP is compared with a designated Teequiv, and the flip angle changing pattern FAP is changed according to the comparison result to search for the flip angle changing pattern FAP which gives a desired contrast. Then, the flip angle changing pattern FAP which is capable of realizing the designated Teequiv is determined. Then, imaging is performed using each flip angle constitutes the determined flip angle changing pattern FAP.

7 Claims, 17 Drawing Sheets

(51) Int. Cl.
*G01R 33/561* (2006.01)
*G01R 33/58* (2006.01)

(58) Field of Classification Search
USPC .......................................................... 324/307
See application file for complete search history.

(56) References Cited

U.S. PATENT DOCUMENTS

2011/0291651 A1* 12/2011 Umeda ............ G01R 33/56554
324/307
2012/0112743 A1* 5/2012 Granlund ........... G01R 33/5614
324/309

OTHER PUBLICATIONS

Reed F. Busse, "Reduced RF Power Without Blurring: Correcting for Modulation of Refocusing Flip Angle in FSE Sequences", Magnetic Resonance in Medicine, Apr. 26, 2007, vol. 51, No. 5, 1031.
Reed F. Busse et al., "Fast Spin Echo Sequences With Very Long Echo Trains: Design Of Variable Refocusing Flip Angle Schedules and Generation of Clinical T2 Contrast", Magnetic Resonance in Medicine, May 2006, vol. 55, No. 5, 1030.
Reed F. Busse et al., "Effects of Refocusing Flip Angle Modulation and View Ordering in 3D Fast Spin Echo", Magnetic Resonance in Medicine, Sep. 2008, vol. 60, No. 3, 640.
Matthias Weigel et al., "Contrast Behavior and Relaxation Effects of Conventional and Hyperecho-Turbo Spin Echo Sequences at 1.5 and 3 T", Magnetic Resonance in Medicine, Apr. 2006, vol. 55, No. 4, 826.

\* cited by examiner

FIG.3
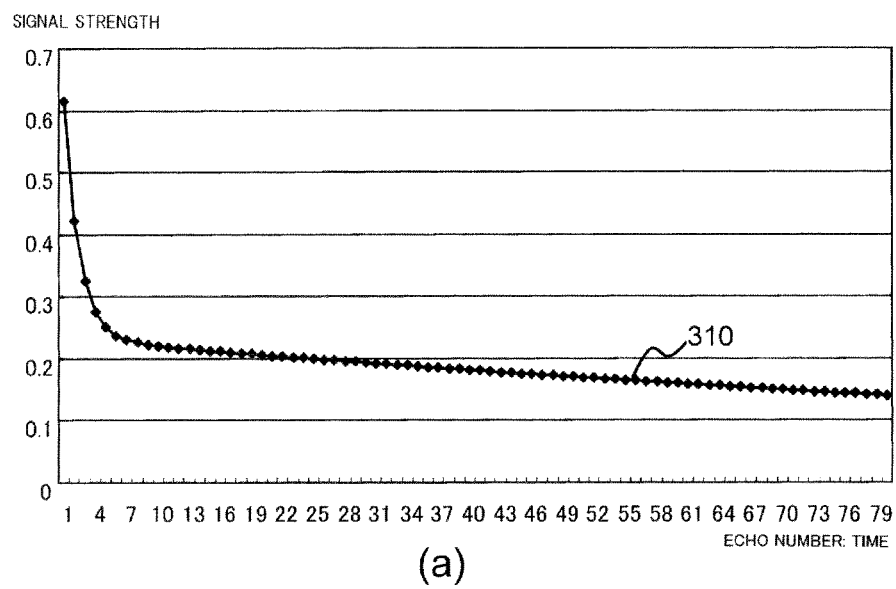
(a)
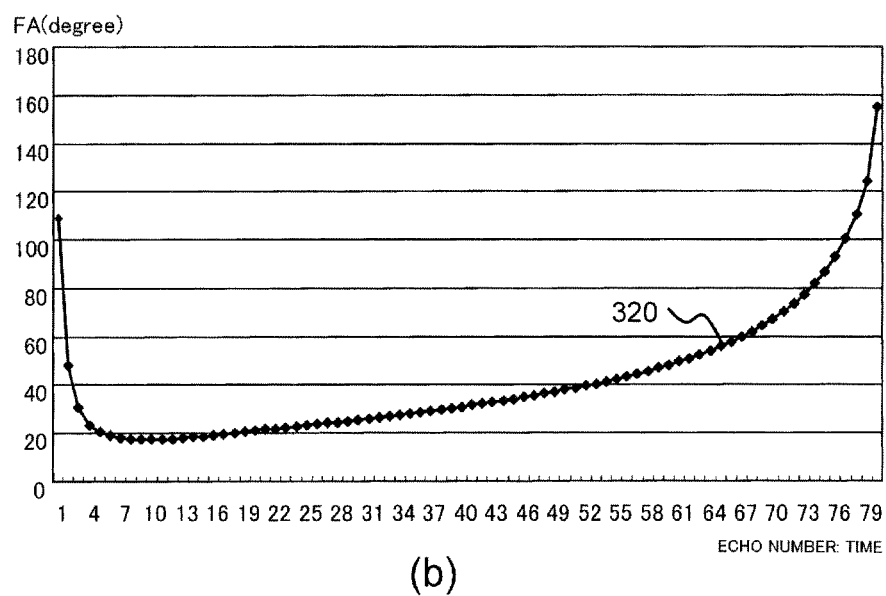
(b)

FIG.6
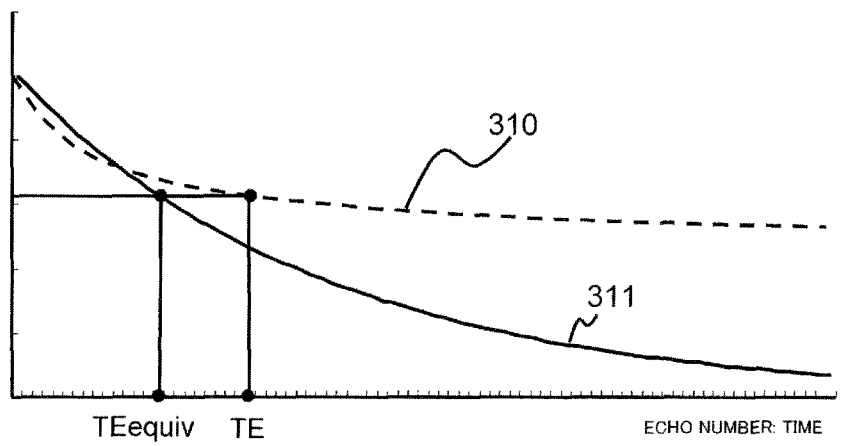
(a)
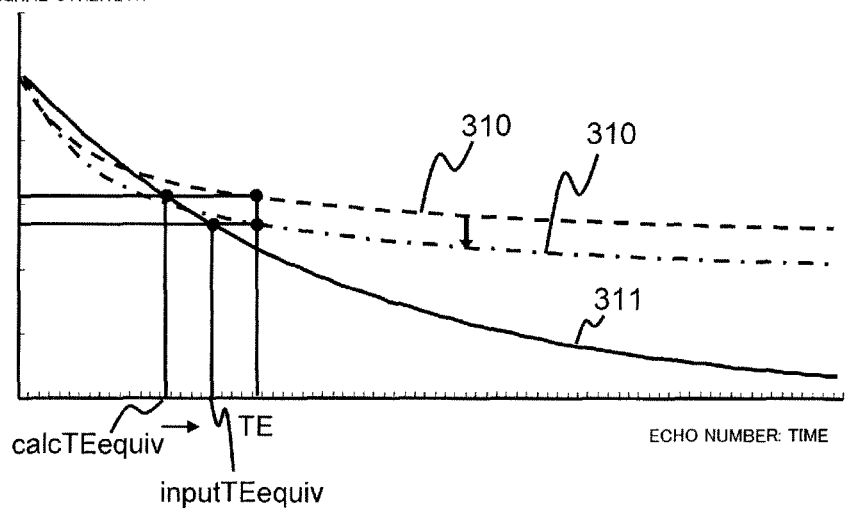
(b)

FIG.11
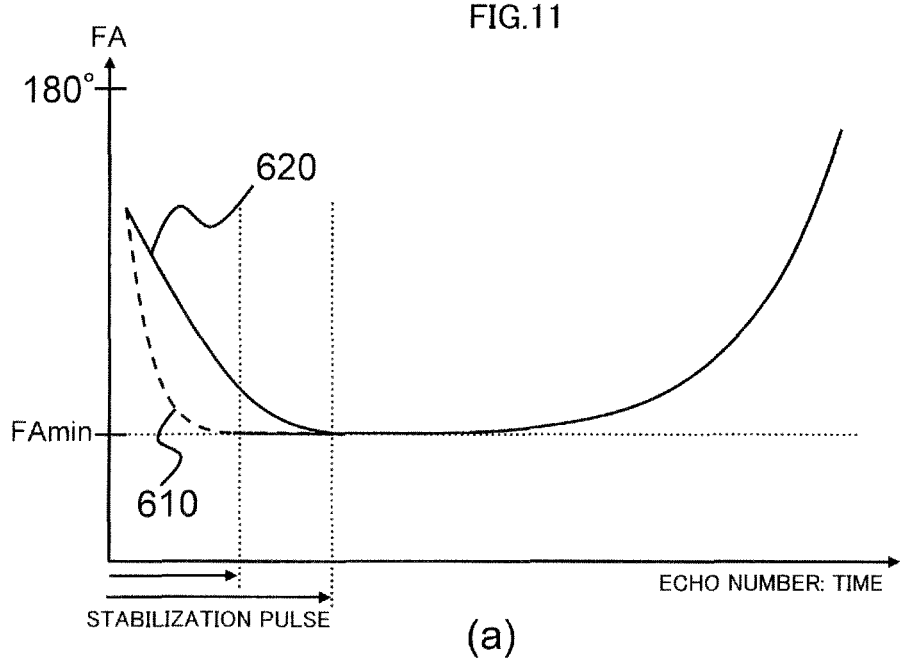
(a)
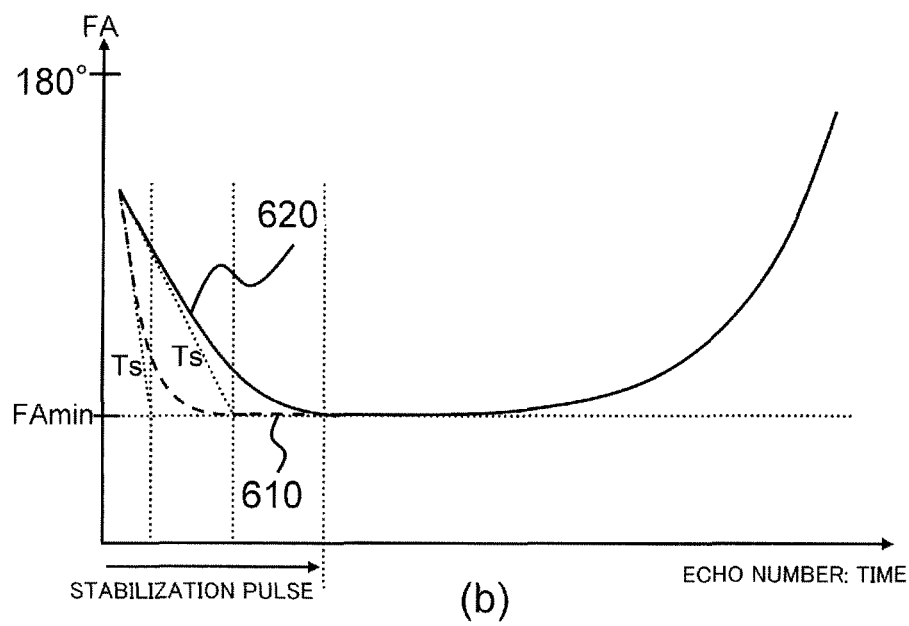
(b)

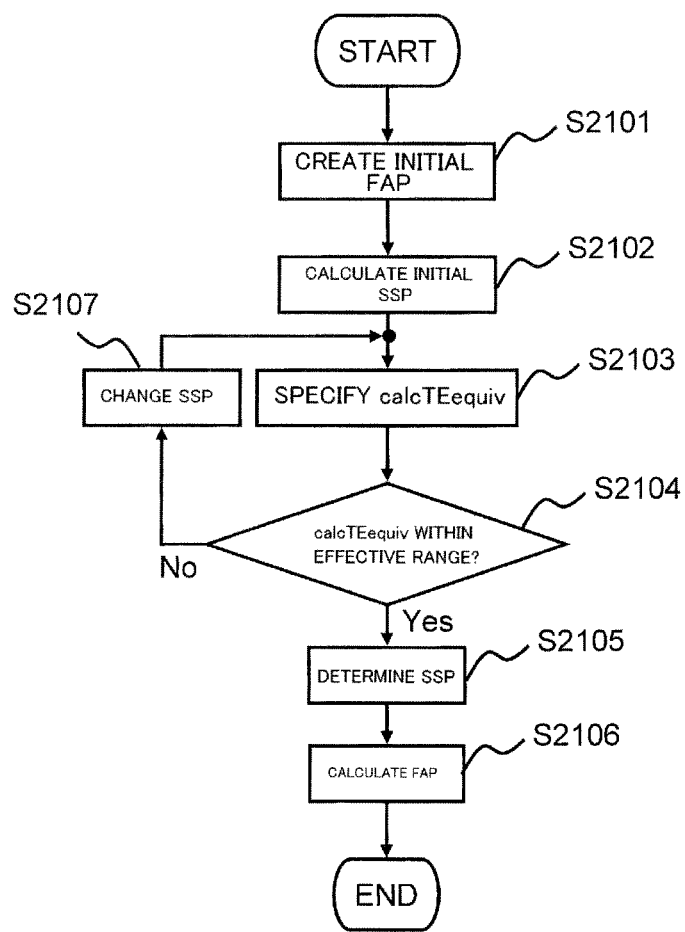

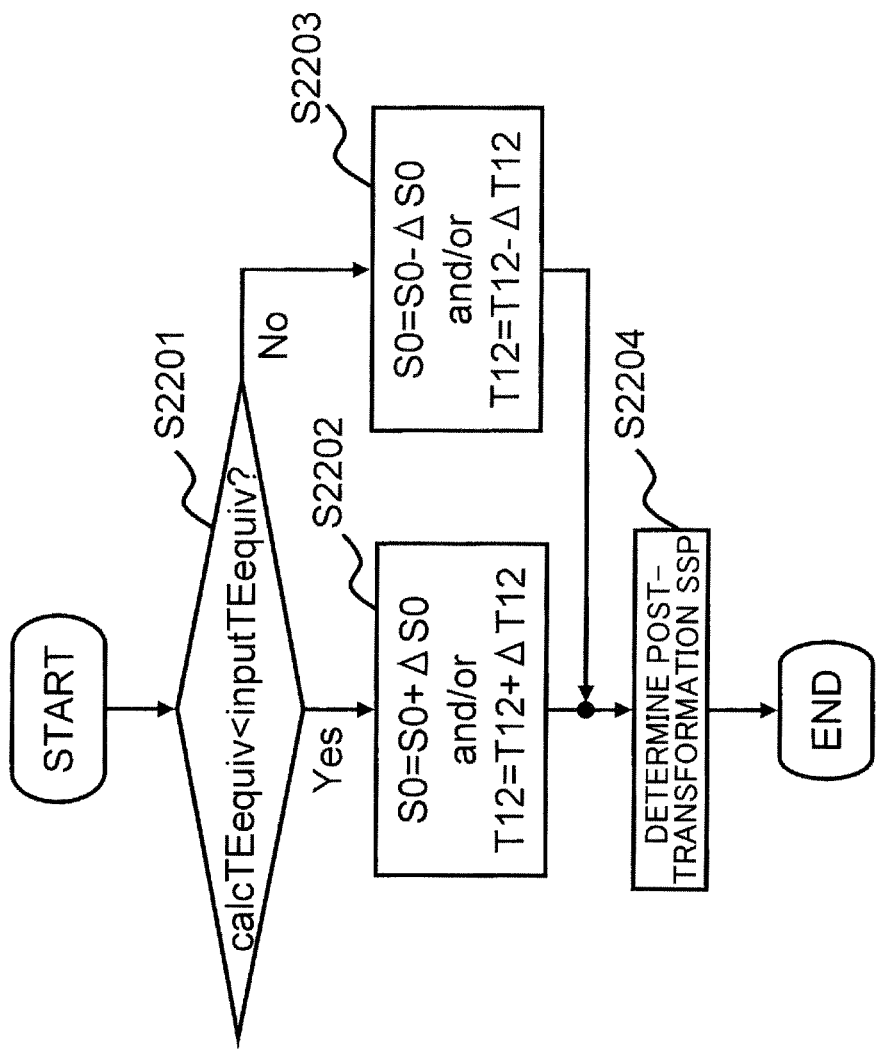

MAGNETIC RESONANCE IMAGING APPARATUS AND FLIP ANGLE DETERMINATION METHOD

FIELD OF THE INVENTION

The present invention relates to a magnetic resonance imaging (hereinafter referred to as MRI) technique which measures nuclear magnetic resonance (hereinafter referred to as NMR) signals from hydrogen, phosphor, and the like in an object and creates an image of nucleic density distribution, relaxation time distribution, and the like, particularly to a technique for determining a flip angle of a refocus high-frequency magnetic field pulse which causes the nuclear magnetization to be refocused.

DESCRIPTION OF RELATED ART

The MRI apparatus is an apparatus that measures an NMR signal (echo signal) generated by an object, especially, the nuclear spins that form human tissue, and images the shapes or functions of the head, abdomen, limbs, and the like in a two-dimensional manner or in a three-dimensional manner. In the imaging, different phase encoding and different frequency encoding are given to NMR signals according to the gradient magnetic field, and the NMR signals are measured as time series data. The measured echo signals are reconstructed as an image by two-dimensional or three-dimensional Fourier transform.

Echo signals are measured in accordance with a previously set imaging sequence. There are various imaging sequences, including a Fast Spin Echo (ESE) sequence. In FSE sequence, after applying an excitation pulse, plural echo signals are acquired within repetition time TR by plural refocus high-frequency magnetic field pulses (refocus RF pulses). This group of plural echo signals is referred to as an echo train. The flip angle (FA) of these plural refocus RF pulses is generally set at 180°.

However, there are times that the FA of these refocus RF pulses is set with a different value for each pulse for various purposes. Such imaging sequence is referred to as Variable Refocus Flip Angle (VRFA) sequence. By setting variable refocus FA sequence at a different value for each pulse, for example blurring of images can be reduced (see Patent Document 1) or the signal-to-noise ratio (SNR) can be improved (see Non-patent document 1). Further, by setting refocus FA sequence at a different value for each pulse within the range smaller than 180°, the specific absorption rate (SAR) which is the energy amount to be absorbed in a human body can be reduced. This is especially effective in a high magnetic field MRI apparatus having a large proportion of SAR.

In a case that the FA of all refocus RE pulses is set as 180°, an echo signal to be acquired indicates T2 decay pattern (T2 decay curve). However in a variable refocus FA sequence, an echo signal to be acquired is not attenuated by T2 decay, but indicates a signal decay pattern in which T1 relaxation and T2 relaxation are mixed (mixed decay curve) that changes T2 contrast of an image. The time in the T2 decay curve on the mixed decay curve having the same signal intensity as that of TE time is referred to a Contrast Equivalent TE (Teequiv), and defines the contrast of an image obtained by a variable refocus FA sequence. Therefore, in order to obtain an image with a desired contrast, a Teequive is to be adjusted. A known method for the adjustment is, for example a method of shifting echoes by half scanning.

Also, there is a known method referred to as an EPG (Extended Phase Graph) which calculates the signal intensity of the respective echo signals acquired from the FA of refocus RF pulses (for example, see Non-patent Document 2). On the other hand, there is a known method referred to as a Prospective EPG which acquires the FA of the respective refocus RF pulses from the signal intensity of the respective echo signals (for example, see Non-patent Document 3).

PRIOR ART DOCUMENT

Patent Document

Patent Document 1: U.S. Pat. No. 7,671,590

Non-Patent Document

Non-Patent Document 1: Reed F. Busse, Anja C. S. Brau, Anthony Vu, Charles R. Michelich Ersin Bayram, Richard Kijowski, Scott B. Reeder, and Howard A. Rowley. "Effects of Refocusing Flip Angle Modulation and View Ordering in 3D Fast Spin Echo." Magnetic Resonance in Medicine 60:640-649 (2008)

Non-patent Document 2: Juergen Hennig. "Multiecho Imaging Sequences with Low Refocusing Flip Angles" Journal of Magnetic Resonance 78:397-407 (1988)

Non-patent Document 3: Juergen Hennig, Matthias Weigel, and Klaus Sheffler. "Calculation of Flip Angles for Echo Trains with Predefined Amplitudes with the Extended Phase Graph (EPG)-Algorithm; Principles and Applications to Hyperecho and TRAPS Sequences." Magnetic Resonance in Medicine 51:68-80 (2004)

SUMMARY OF INVENTION

Technical Problem

While shifting an echo can change the echo to be placed in the center of a k-space, it generates the difference in level of signal intensities which causes generation of artifacts. When this method is used, half scanning is combined therewith to avoid the difference in level of signal intensity. However in a case in which half scanning is used, the resolution of an image is degraded since an entire region of k-space is not imaged in this method.

Considering the above-described problem, the objective of the present invention is to provide a technique in a variable refocus FA sequence to obtain an image with a desired contrast by suppressing SAR without degrading image quality.

BRIEF SUMMARY OF THE INVENTION

The present invention, upon determining each flip angle of plural refocus high-frequency magnetic field pulses in variable refocus FA sequence, searches the flip angle capable of obtaining an image having a desired contrast specified by contrast information while changing the respective flip angles of plural refocus high-frequency magnetic field pulses, and determines the flip angle acquired from the search as the respective flip angles of the plural refocus high-frequency magnetic field pulses.

Effect of the Invention

In accordance with the present invention, it is possible to obtain an image with a desired contrast while suppressing SAR in a variable refocus FA sequence without degrading the image quality.

BRIEF DESCRIPTION OF THE DRAWINGS

FIG. 3(a) is a graph showing a signal decay pattern of a variable refocus FA sequence in Embodiment 1, and FIG. 3(b) is a graph showing an FA changing pattern of a variable refocus FA sequence in Embodiment 1.

FIG. 6(a) is a view for explaining a TEequiv, and FIG. 6(b) is a view for explaining an FA changing pattern determining method in Embodiment 1.

FIGS. 11 (a) and (b) are views for explaining another example of the FA changing method in Embodiment 1.

FIG. 16 is a flowchart of the FA determining process in Embodiment 2.

FIG. 17 is a flowchart of a signal decay pattern changing process in Embodiment 2.

DETAILED DESCRIPTION OF THE INVENTION

Embodiment 1

Figure 1:
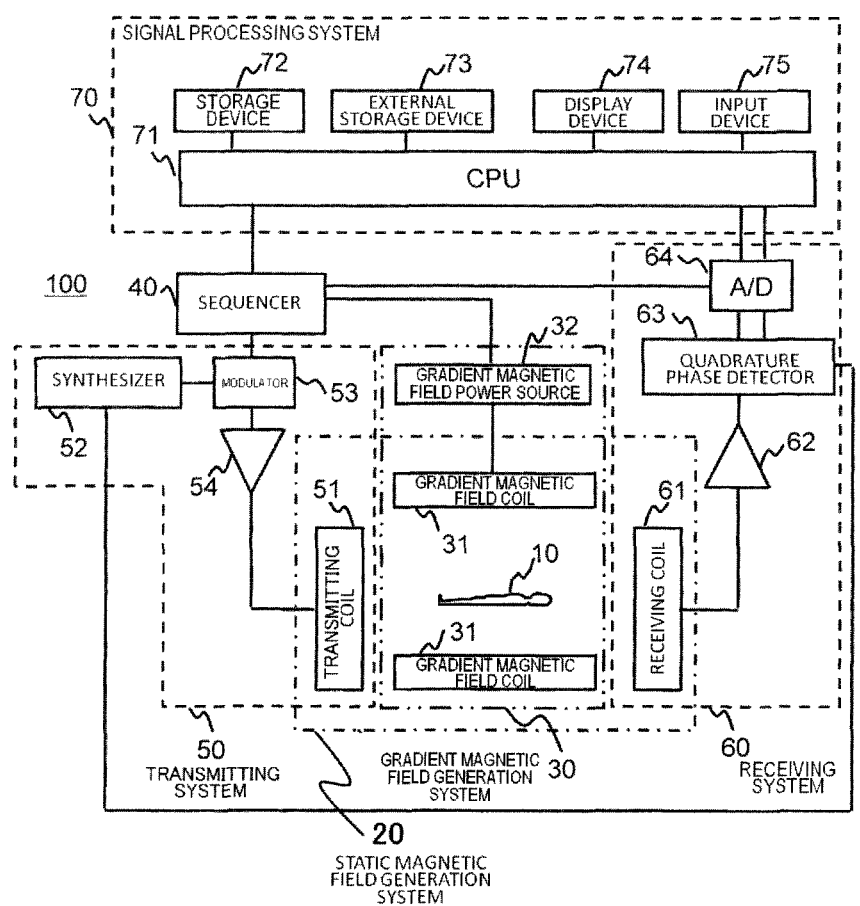
FIG. 1 is a block diagram of an MRI apparatus in Embodiment 1.

Embodiment 1 of the present invention will be described below. In the following description, the same function parts are represented by the same reference numerals in all drawings for explaining embodiments of the present invention, and the duplicative description thereof is omitted.

First, brief overview of an MRI apparatus 100 in the present embodiment will be described referring to FIG. 1. FIG. 1 is a block diagram showing the general configuration of the MRI apparatus 100 in the present embodiment. The MRI apparatus 100 of the present embodiment obtains a tomographic image of an object to be examined using NMR phenomenon, and comprises a static magnetic field generating system 20, a gradient magnetic field generating system 30, a sequencer 40, a transmitting system 50, a receiving system 60 and a signal processing system 70.

The static magnetic field generating system 20 generates a uniform static magnetic field in a surrounding space of an object 10 in a direction perpendicular to the body axis in the case of a vertical magnetic field method and in the body axis direction in the case of a horizontal magnetic field method. A permanent magnet type, normal conduction type, or superconducting type static magnetic field generator is disposed around the object 10.

The gradient magnetic field generation system 30 includes gradient magnetic field coils 31 wound in three axial directions of X, Y, and Z, which are the coordinate system (stationary coordinate system) of the MRI apparatus 100, and a gradient magnetic field power source 32 for driving each of the gradient magnetic field coils 31, and applies gradient magnetic fields Gx, Gy, and Gz in the three axial directions of X, Y, and Z by driving the gradient magnetic field power source 32 of each coil according to an instruction from the sequencer 40, which will be described later. At the time of imaging, a slice-direction gradient magnetic field pulse (Gs) is applied in a direction perpendicular to a slice surface (imaging cross-section) so that a slice surface is set for the object 10, and a phase-encoding-direction gradient magnetic field pulse (Gp) and a frequency-encoding-direction gradient magnetic field pulse (Gf) are applied in the two remaining directions, which are perpendicular to the slice surface and are also perpendicular to each other, so that the position information in each direction is encoded in the NMR signal (echo signal).

The sequencer 40 controls the gradient magnetic field generation system 30, the transmission system 50, and the receiving system 60 to apply a high frequency magnetic field pulse (hereinafter, referred to as an "RF pulse") and a gradient magnetic field pulse repeatedly according to the predetermined imaging sequence. The sequencer 40 operates according to a control signal from a CPU 71 provided in the signal processing system 70, which will be described later, and transmits various instructions, which are required for the data collection of a tomographic image of the object 10, to the gradient magnetic field generation system 30, the transmission system 50, and the receiving system 60.

The transmission system 50 emits an RF pulse to the object 10 in order to cause nuclear magnetic resonance in the nuclear spins of atoms that form the body tissue of the object 10, and includes a high frequency oscillator (synthesizer) 52, a modulator 53, a high frequency amplifier 54, and a transmission-side high frequency coil (transmission coil) 51. The high frequency pulse output from the synthesizer 52 is amplitude-modulated by the modulator 53 at a timing according to the instruction from the sequencer 40, and the amplitude-modulated high frequency pulse is amplified by the high frequency amplifier 54 and is supplied to the transmission coil 51 disposed adjacent to the object 10. As a result, an RF pulse is emitted to the object 10.

The receiving system 60 detects an echo signal (NMR signal) emitted by nuclear magnetic resonance of the nuclear spins of atoms, which form the body tissue of the object 10, and includes a receiving-side high frequency coil (receiving coil) 61, a signal amplifier 62, a quadrature phase detector 63, and an A/D converter 64. The echo signal of the response of the object 10 induced by the electromagnetic waves emitted from the transmission coil 51 is detected by the receiving coil 61 disposed adjacent to the object 10 and is amplified by the signal amplifier 62. Then, at a timing according to the instruction from the sequencer 40, the amplified signal is divided into signals of two systems perpendicular to each other by the quadrature phase detector 63, and each signal is converted into a digital amount by the A/D converter 64 and is transmitted to the signal processing system 70.

The signal processing system 70 performs various kinds of data processing, display and storage of processing results, and the like, and includes a CPU 71, a storage device 72, an external storage device 73, a display device 74, and an input device 75. For example, a tomographic image of the object 10 is reconstructed using the data from the receiving system 60. In addition, a control signal is transmitted to the sequencer 40 according to the imaging sequence. The reconstructed tomographic image is displayed on the display device 74 and is also recorded on the storage device 72 or the external storage device 73. The input device 75 is used when the operator inputs various kinds of control information of the MRI apparatus 100 or control information of processing performed in the signal processing system 70, and includes a trackball or a mouse, and a keyboard. This input device 75 is disposed adjacent to the display device 74, so that the operator controls various kinds of processing of the MRI apparatus 100 interactively through the input device 75 while viewing the display device 74.

In addition, in FIG. 1, the transmission coil 51 and the gradient magnetic field coil 31 are provided in the static magnetic field space of the static magnetic field generating system 20, in which the object 10 is inserted, so as to face the object 10 in the case of a vertical magnetic field method and so as to surround the object 10 in the case of a horizontal magnetic field method. In addition, the receiving coil 61 is provided so as to face or surround the object 10.

Currently, nuclides imaged by an MRI apparatus, which are widely used clinically, are a hydrogen nucleus (proton) that is a main component material of the object. The shapes or functions of the head, abdomen, limbs, and the like of the human body are imaged in a two-dimensional or three-dimensional manner by imaging the information regarding the spatial distribution of the proton density or the spatial distribution of the relaxation time of the excited state.

The imaging sequence by which the CPU 71 of the signal processing system 70 gives a control signal to the sequencer 40 is determined by a pulse sequence, by which the application timing of the RF pulse and the gradient magnetic field pulse is determined, and a parameter specifying the application strength, application timing, and the like of the RF pulse and the gradient magnetic field pulse. The pulse sequence is set in advance, and is stored in the storage device 72. In addition, the parameter is calculated in the signal processing system 70 on the basis of the imaging conditions set by the operator through the input device 75.

The above-described pulse sequence to be used in the present embodiment will be described below. In the present embodiment, a pulse sequence provided with plural refocus RF pulses such as FSE (Fast Spin Echo) is used as a pulse sequence. In the present embodiment, a case in which an FSE is used will be described. In addition, the pulse sequence to be used in the present embodiment may be an FSE or FIR which applies plural refocus RF pulses within a repetition time TR after an excitation pulse (90° pulse).

Figure 2:
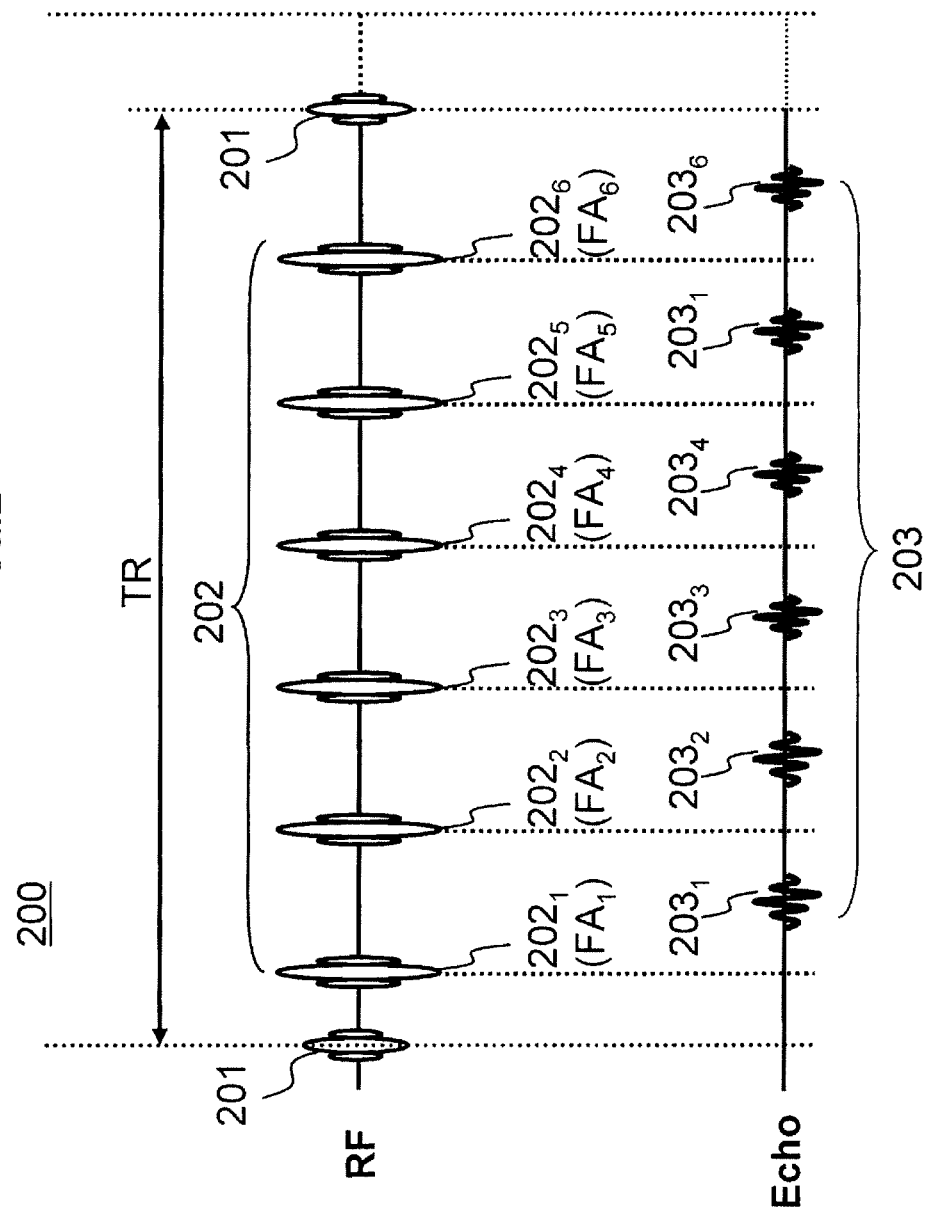
FIG. 2 is a sequence diagram of an ESE pulse sequence.

FIG. 2 shows the application timing of an RF pulse of an FSE pulse sequence 200 and the acquisition timing of an echo signal. As shown in the diagram, after applying an excitation RF pulse (90° pulse) 201, plural (six here as an example) refocus RF pulses 202 ($202_1$, $202_2$, $202_3$, $202_4$, $202_5$ and $202_6$) are applied during a TR. Then after applying the respective refocus RF pulses 202, echo signals 203 ($203_1$, $203_2$, $203_3$, $203_4$, $203_5$ and $203_6$) are measured.

In the present embodiment, a variable-type refocus FA sequence is used in which the respective flip angles (FA: $FA_1$, $FA_2$, $FA_3$, $FA_4$, $FA_5$ and $FA_6$) of the refocus RF pulses 202 are set as variable. In the following description of the present embodiment, N-number (N is an integer) of refocus RF pulses are applied after one excitation RF pulse 201 is applied, and each of the refocus RF pulses is referred to as refocus RF pulse $202_n$ (n is an integer which satisfies $1 \leq n \leq N$). The index n is to be appended in order of applications. Also, the flip angle of refocus RF pulse $202_n$ to be applied at the n-th time is expressed as $FA_n$. Also, the flip angle $FA_n$ of the refocus RF pulse $202_n$ to be applied at the n-th time is referred to as the n-th FA. The echo signal to be measured right after the application of a refocus RF pulse $202_n$ to be applied at the n-th time is set as echo signal $203_n$, and the echo number thereof is set as n. When there is no particular need to distinguish them for each echo number, they are referred to as a refocus RF pulse 202, flip angle FA and echo signal 203.

Further, alignment in order of each value in the $1^{st}$ through the N-th flip angles FA (FA value sequence) is referred to as an FA changing pattern FAP, and alignment in order of each signal intensity values in the $1^{st}$ through the N-th echo signal 203 (signal intensity value sequence) is referred to as a signal decay pattern SSP. In other words, the FA changing pattern FAP is constituted by the FA of each refocus RE pulse, and the signal decay pattern SSP is constituted by the signal intensity for each echo signal (echo number) acquired with respect to each refocus RF pulse. A representative signal decay pattern SSP (signal decay curve) 310 and FA changing pattern FAP (FA changing curve) 320 of a variable-type refocus FA sequence are shown respectively in FIG. 3(a) and FIG. 3(b).

The present embodiment determines the FA changing pattern FAP (FA value sequence of each refocus RF pulse 202) using the imaging conditions received by an operator so that the echo time (TEequiv) which is the parameter for determining substantive contrast in an image in the variable-type refocus FA sequence becomes approximately the same as the echo time for acquiring desired contrast, and creates an imaging sequence using the determined FA value. Then the imaging is executed using the created imaging sequence.

Figure 4:
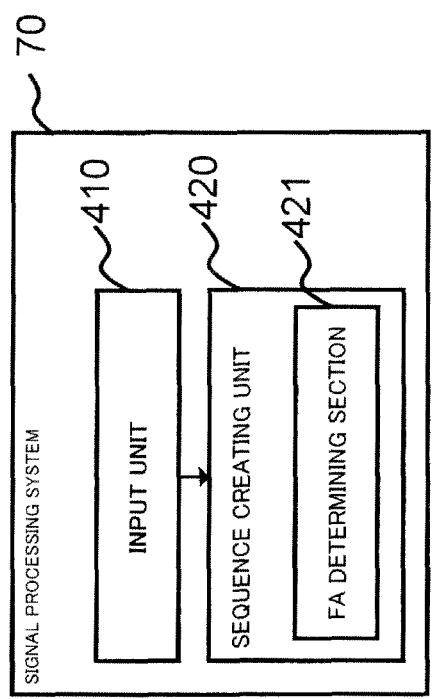
FIG. 4 is a function block diagram of a signal processing system in Embodiment 1.

For this reason, the signal processing system 70 of the present embodiment comprises a receiving unit 410 configured to receive input of imaging conditions from an operator and a sequence creating unit 420 configured to create an imaging sequence to be used for imaging from a previously stored pulse sequence and the received imaging condition, as shown in FIG. 4. The CPU 71 achieves the receiving unit 410 and the sequence creating unit 420 by loading to a memory and implementing a program stored in advance in a storage device 72 or an external storage device 73.

Figure 5:
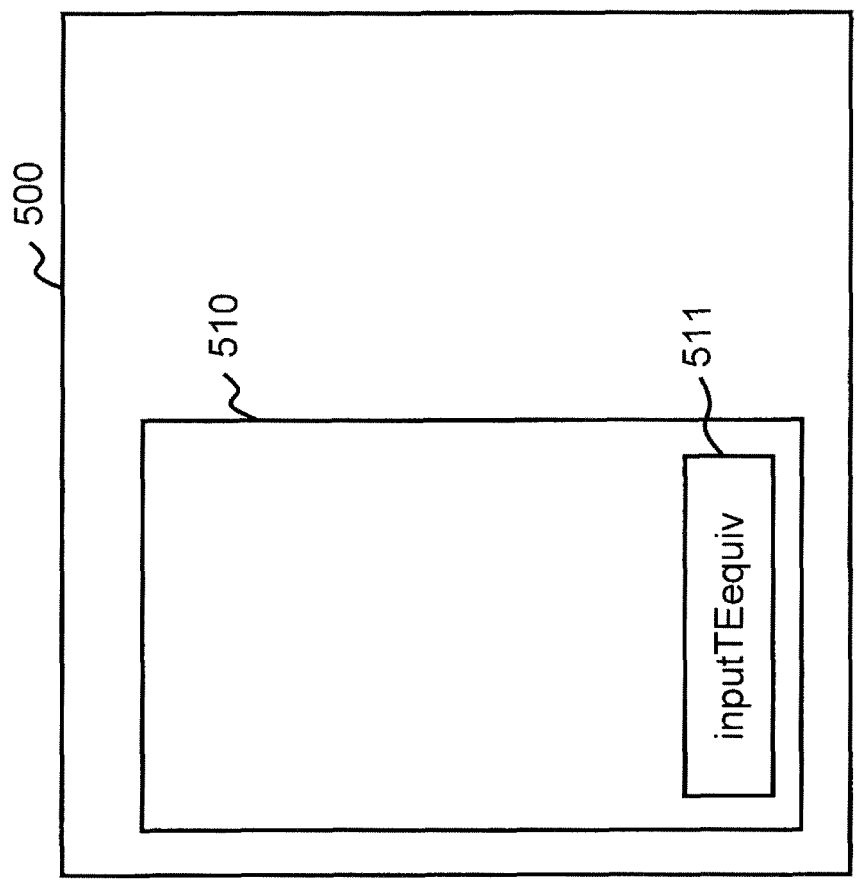
FIG. 5 is a view for explaining a UI screen in Embodiment 1.

The receiving unit 410 receives a TEequive for specifying a desired contrast, in addition to the imaging condition such as T1 and T2 for normal imaging. The TEequiv to be received by the receiving unit 410 is referred to as an input TEequive. The receiving unit 410 creates a User Interface (UI) screen for receiving imaging conditions, and displays the created screen on a display device 74. An example of a UI screen 500 to be created and displayed by the receiving unit 410 is shown in FIG. 5.

As shown in the diagram, the UI screen 500 in the present embodiment comprises an imaging condition input area 510 which receives input of the initial FA value of each refocus RF pulse and imaging conditions such as T1 and T2. The imaging condition input area 510 comprises an input-TE-equive input area 511 for receiving input of an input TEeqiuv. The receiving unit 410 in the present embodiment receives the imaging conditions which are input via the imaging condition input area 510.

The sequence creating unit 420 in the present embodiment comprises an FA determining section 421 as shown in FIG. 4 configured to determine an FA changing pattern FAP. The FA determining section 421 determines an FA changing pattern FAP for setting a desired TEeqiuiv (input TEequiv).

The FA determining section 421, for each FA changing pattern FAP, calculates the TEequiv as a calcTEequiv by calculating the signal decay pattern SSP which can be acquired in the FA changing pattern. Then the FA determining section 421 compares the calcTEequive and the input-TEequiv, changes the FA changing pattern FAP in accordance with the comparison result using a previously determined method, and repeats the comparison between the calcTEequiv and inputTEequiv. The comparison will be repeated until the calcTEequiv falls within the effective range of the inputTEequiv. Also, a commonly known method such as EPG (Extended Phase Graph) disclosed in Non-patent Document 2 is used for calculating the signal decay pattern SSP from the FA changing pattern FAP.

A TE equive will be described below referring to FIG. 6(a). As described above, the TE equiv is the acquisition time on a T2 decay curve 311 of the echo signal having the same signal intensity as the echo signal (echo signal at time TE (execution TE)) arranged at the center of a k-space on a signal decay curve 310 of the variable-type refocus FA sequence. As described above, the T2 decay curve 311 is the signal decay curve in a case in which the FA of all refocus RF pulses are set at 180°. Therefore, the TEequiv for determining the contrast of a variable-type refocus FA sequence can be defined when the signal decay curve 310 is determined.

The signal decay curve 310 changes along the change of FA changing pattern FAP. In the present embodiment, as shown in FIG. 6(b), the pattern of an acquired signal decay curve 310 is changed by changing the pattern of the FA changing pattern FAP, and sets the calcTEequiv as an inputTEequiv which is specified by an operator.

A sequence creating unit 420 in the present embodiment generates an imaging sequence using the FA changing pattern FAP determined by the FA determining section 421 and the imaging condition. Then the signal processing system 70 in the present embodiment issues a command to the respective units via the sequencer 40 according to the determined imaging sequence, and executes the imaging.

Figure 7:
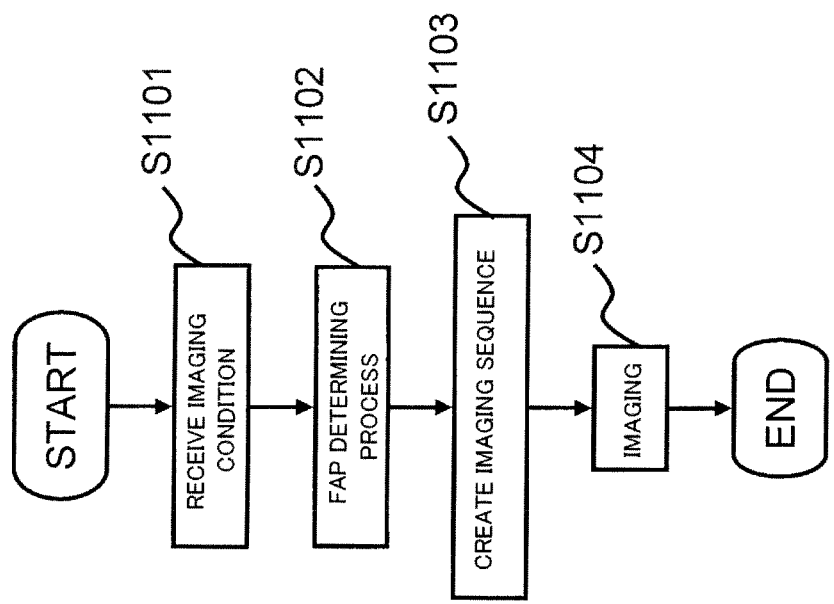
FIG. 7 is a flowchart showing an imaging process in Embodiment 1.

Next, the flow of an imaging process by the signal processing system 70 in the present embodiment will be described. FIG. 7 is a processing flow of the imaging process in the present embodiment. The imaging process starts by receiving a starting command from an operator.

The receiving unit 410 receives the imaging conditions including the inputTEequiv which is input by the operator via the created UI screen 500 (step S1101). Then the sequence creating unit 420 causes the FA determining section 421 to determine the FA changing pattern FAP which achieves a desired contrast using the received imaging condition (FA determining process: step S1102). Then the sequence creating unit 420 creates an imaging sequence using the determined FA changing pattern and the imaging condition received in step S1101 (step S1103). Then the signal processing system 70 issues a command to the sequencer 40 using the created imaging sequence, and executes an imaging (step S1104).

Figure 8:
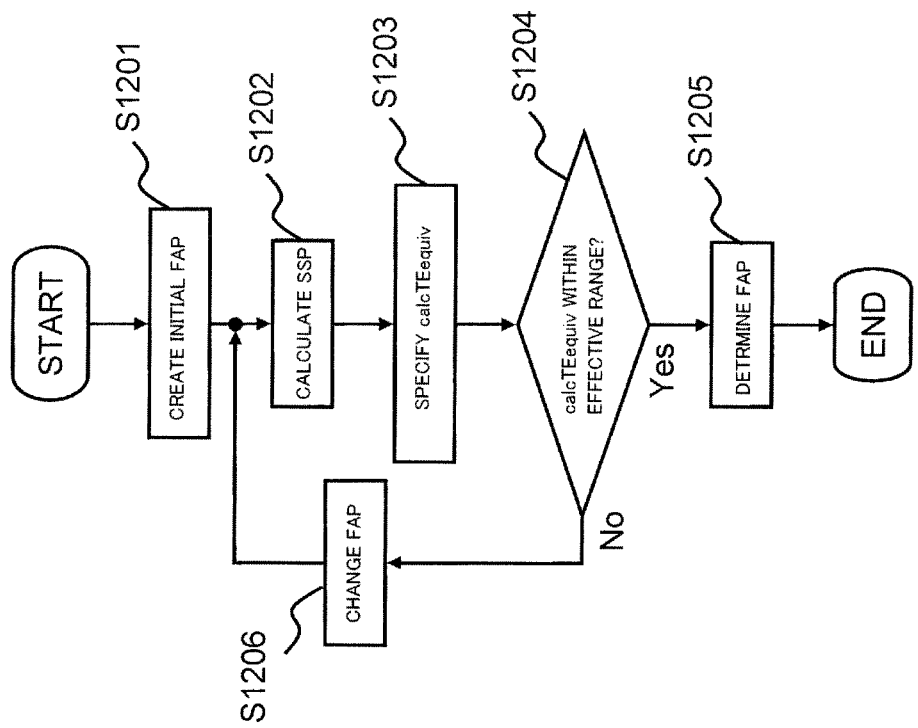
FIG. 8 is a flowchart showing an FA determining process in Embodiment 1.

Next, the flow of an FA determining process by the FA determining section 421 of the above-described step S1102 will be described. FIG. 8 is a processing flow of the FA determining process in the present embodiment.

The FA determining section 421 creates the initial FA changing pattern FAP which is the initial value of the FA changing pattern FAP from the received imaging condition (step S1201). As for the initial FA changing pattern FAP, the FA specified by an imaging condition may be used, or may also be the FA changing pattern FAP which is created by a previously defined method for achieving a specific objective.

Next, the FA determining section 421 calculates a signal decay pattern SSP using a method such as an EPG from the FA changing pattern FAP (step S1202), and specifies a calTEequiv on the calculated signal decay pattern SSP (step S1203).

The FA determining section 421 determines whether or not the specified calcTEequiv is within the effective range of the inputTEequiv (step S1204). Then if the calcTEequiv is within the effective range, the FA determining section determines the FA changing pattern FAP by which the signal decay pattern SSP is calculated in step S1202 as the output (output FAP) of the FA determining section 421 (step S1205). The effective range here should be determined in advance and stored in a device such as the storage device 72.

On the other hand, if the calcTEequiv is not within the effective range, the FA determining section 421 changes the FA changing pattern FAP using a previously determined method (FAP changing process: step S1206), proceeds to step S1202 and repeats the process.

Using the above-described procedure, the FA determining section 421 determines the FA changing pattern for achieving a desired TEequiv (inputTEequive).

Next, an FAP changing process by the FA determining n 421 for changing the FA changing pattern FAP in step S1206 will be described. In the present embodiment, the FA determining section 421 changes the FA changing pattern FAP by controlling (changing) the minimum FA (FAmin) among the FA changing patterns FAP so that the calcTEequiv falls within the effective range of the inputTEequiv.

The FA determining section 421 compares the calcT-Eequiv and the inputTEequiv, and determines the process of changing the FAmin in accordance with the comparison result. Here, when calcTEequiv is smaller than inputTEequiv, (calcTEequiv<inputTEequiv), the FAmin is to be made greater (increased). On the other hand, when calcT-Eequiv is greater than inputTEequiv (calcTEequiv>inputTEequiv), the FAmin is to be made smaller (decreased).

The amount for changing the FAmin (variation ΔFA) is to be previously determined. Also, the other FAs which constitute the FA changing pattern are to be changed in accordance with variation ΔFA of the FAmin. In other words, the FA changing pattern FAP is changed on a basis of a predetermined FA value in a similar figure. As for a predetermined FA value, a previously determined value is to be used such as 180° which is the maximum value of an FA, the maximum value of each FA which constitutes the FA changing pattern and the maximum value of a previously determined FA (FAH).

For example, in a case that an FAH is used for the reference value, when the minimum value of the FA changing pattern after the change is set as FAmin2, each FA is set as the following value FA2.

$$FA2 = FAH - (FAH - FAmin2)(FAH - FA)/(FAH - FAmin) \quad (1)$$

The conversion of the FA changing pattern FAP by converting an FA into FA2 in accordance with the equation (1) is referred to as similarity transformation.

Figure 9:
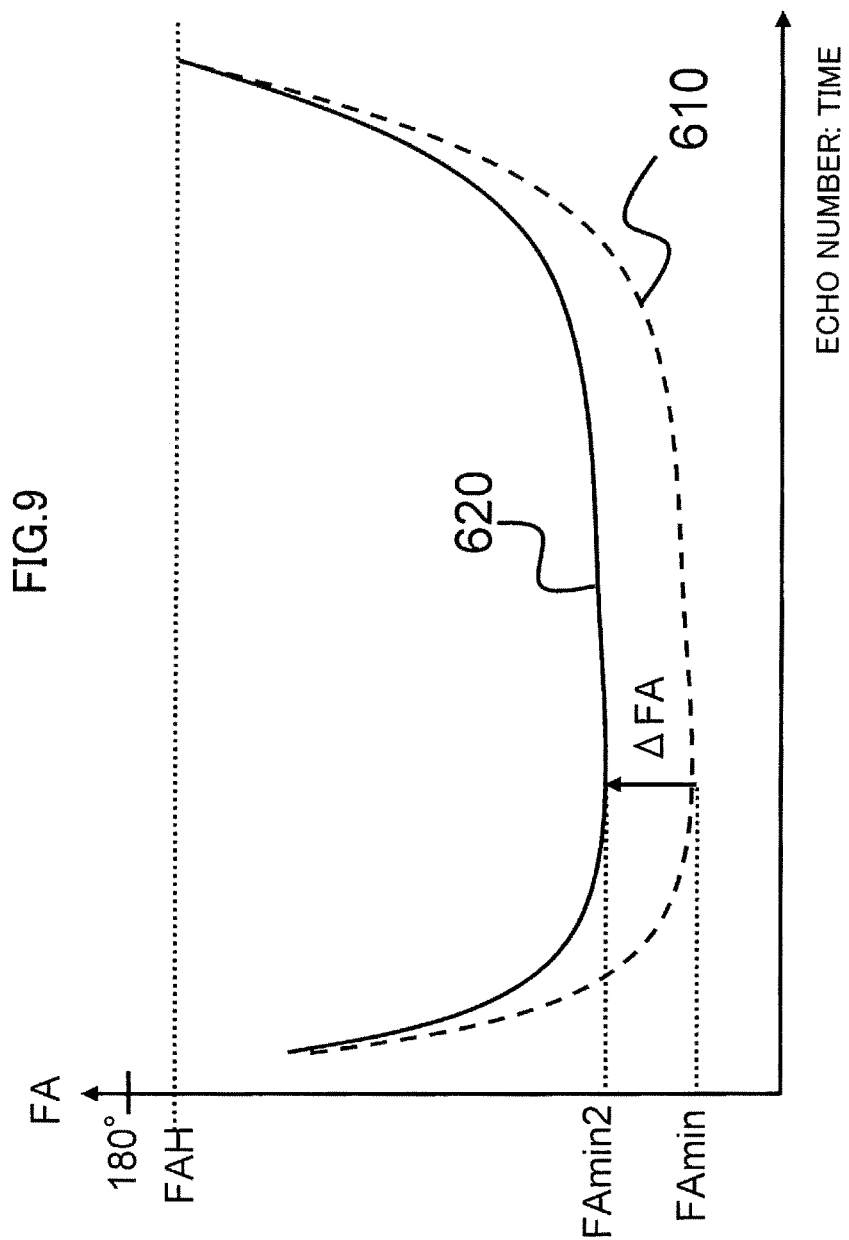
FIG. 9 is a view for explaining an FA changing method in Embodiment 1.

The method for changing an FA changing pattern FAP in a case that calcTEequiv<inputTEequiv is shown in FIG. 9. Here, the FA changing pattern FAP before the change is represented by a pre-change FAP 610 and the FA changing pattern after the change is represented by a post-change FAP 620. Also, the longitudinal axis indicates an FA and the lateral axis indicates an ETL (echo number and time) in FIG. 9.

Figure 10:
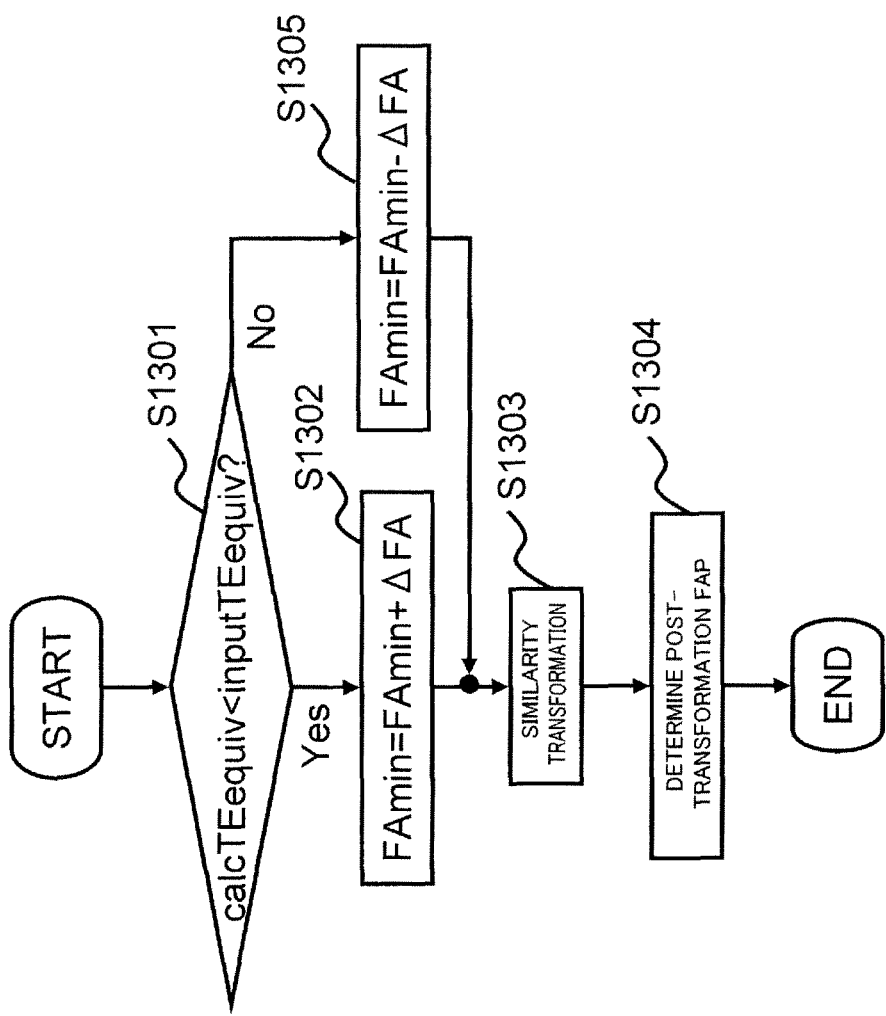
FIG. 10 is a flowchart showing an FAP changing process in Embodiment 1.

The flow of an FAP changing process by the above-described FA determining section 421 will be described. FIG. 10 is a processing flow of the FAP changing process in the present embodiment. The FA determining section 421, when a calTEequiv and an inputTEequiv are compared in the above-described step 1206 and are not in the effective range, the present process is to be carried out.

The FA determining section 421 first distinguishes the size of the calcTEequiv and inputTEequiv (step S1301). Then when the calcTEequiv is smaller than the inputTEequiv (calcTEequiv<inputTEequiv), the FA determining section 421 enlarges the size of the FAmin by a predetermined variation ΔFA and sets it as FAmin2 (step S1302). Next, the FA determining section 421 determines the other FA values by performing the similarity transformation in accordance with the equation (1) (step S1303), and sets the determined value as the FA changing pattern FAP after the conversion (step S1304).

On the other hand, when the condition of step S1301 is not satisfied, i.e. when the calcTEequiv is greater than the inputTEequiv (calcTEequiv>inputTEequiv), the FA determining section 421 reduces the size of the FAmin by a predetermined variation ΔFA and sets it as FAmin2 (step S1305). Then step 1303 is carried out.

The variation FA may be a fixed value as mentioned above. Or, it may be the value which is determined by a method such as the golden section method or bisection method using, for example the upper and lower reference values (for example, the maximum value FAH and the minimum value FAL of a predetermined FA). In addition, the FAH and FAL should satisfy the relationship of FAH≤180°, 0°<FAL and FAL<FAH.

As described above, in accordance with the present embodiment, an FA changing pattern FAP with a desired contrast is searched by comparing a TEequiv which is specified by the signal decay pattern SSP acquired by the FA changing pattern FAP with a designated TEequiv and changing the FA changing pattern FAP in accordance with the comparison result. Then the FA changing pattern FAP capable of achieving a designated TEequiv is determined, so as to perform an imaging by using each FA which constitutes the determined FA changing pattern FAP.

Therefore, since a desired TEequiv is achieved by changing the FA changing pattern FAP, i.e. the FA value sequence which also changes the signal intensity value, generation of difference in signal intensities such as en echo shift is prevented. Also, since measurement data in an entire region is used, there is no degradation of image quality due to lowering of the resolution. Further, an SAR can be suppressed since the FA value is set to be smaller than 180°.

In this manner, in accordance with the present embodiment, it is possible to obtain an image with a desired contrast and a suppressed SAR without deteriorating the image quality, even in an image using a variable-type FA sequence.)

While the above-described embodiment changes a changing pattern FAP by changing the FAmin in the FAP changing process, the present embodiment is not limited thereto. As shown in FIG. 11(a) and FIG. 11(b), the changing process may also be configured to control the reduction tendency in the FA of stabilization pulses.

The stabilization pulse is a refocus RF pulse to be applied for smoothly adjusting the signal intensity to be closer to a target value, and the number of pulses specified by a user or set in advance are to be applied from the first pulse. As shown in FIG. 2(b), the pulses are applied by monotonically decreasing the FA in order of application.

In the changing pattern of the stabilization pulse part, by changing a time constant Ts which is approximated by a previously defined exponential function, the FA changing pattern FAP and the signal decay pattern SSP acquired therefrom are changed, so that the calcTEequiv falls into the effective range of the inputTEequiv.

In other words, when the calcTEequiv is smaller than the inputTEequiv (calcTEequiv<inputTEequiv) in step S1301, the FA changing pattern of the stabilization pulse part is made gradual by increasing constant Ts. In concrete terms, as shown in FIG. 11(a), the post-change FAP 620 is acquired by increasing the number of pulses (number of echoes) to be used for the stabilization pulse of the pre-change FAP 610. Or, as shown in FIG. 11(b), the post-change FAP 620 is acquired by decreasing the variation in the stabilization pulse of the pre-change FAP 610.

On the other hand, when the calcTEequiv is larger than the inputTEequiv (calcTEequiv>inputTEequiv) in the above-described step S1301, the time constant Ts is made small and the FA changing pattern of the stabilization pulse part is made steep. In concrete terms, the number of pulses (number of echoes) to be used for stabilization pulses is decreased, or the variation is increased.

The number of pulses (number of echoes) to be increased and the variation amount are to be determined in advance also in a case in which the previously-described method is used. They may also be determined by the golden section method or bisection method.

Also, the method in the above-described embodiment and the previously-mentioned adjustment by stabilization pulses may be combined.

Figure 12:
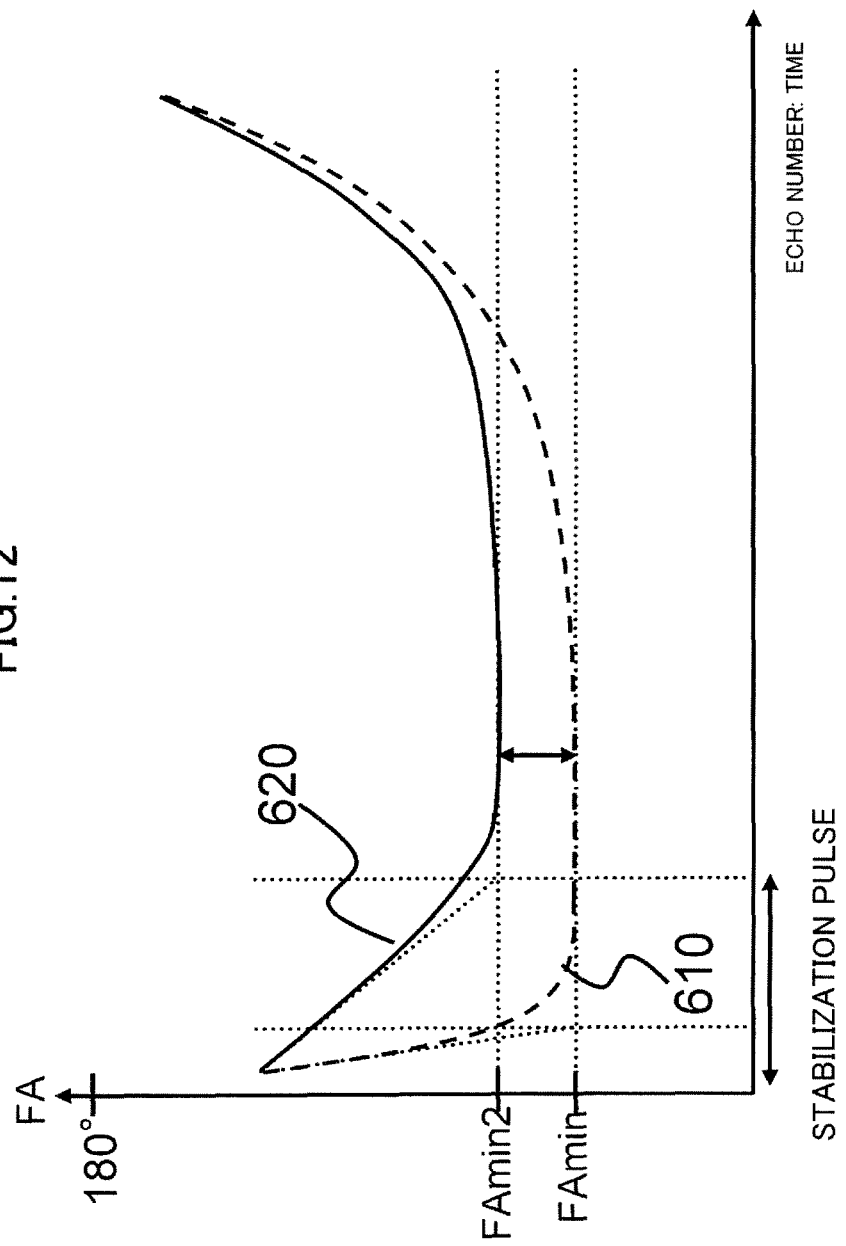
FIG. 12 is a view for explaining another example of the FA changing method in Embodiment 1.

In this case, when calcTEequiv<inputTEequiv in step S1301 of the above-described FAP changing process, the FAmin of the pre-FAP 610 is made larger by ΔFA, and the post-FAP 620 is acquired by performing the similarity transformation on the entire FA changing pattern FAP using the above-described method and making the changing pattern of the stabilization pulse part gradual. The method for changing the FA changing pattern FAP in this case is shown in FIG. 12.

Also in the above-described step 1301, in a case that calcTEequiv>inputTEequiv, the FAmin is made smaller by ΔFA, the similarity transformation is performed on the entire FA changing pattern FAP using the above-described method, and the changing pattern of the stabilization pulses is made steep.

The variation of the similarity transformation and the variation of the changing transformation in the stabilization pulse part, or the method for calculating a variation are also to be determined in advance in this case. Also, either of the similarity transformation or the pattern transformation in the stabilization pulse part may be performed first. It is not necessary to perform both of the transformations for each determination process in step 1301, thus only one of them may be performed.

Figure 13:
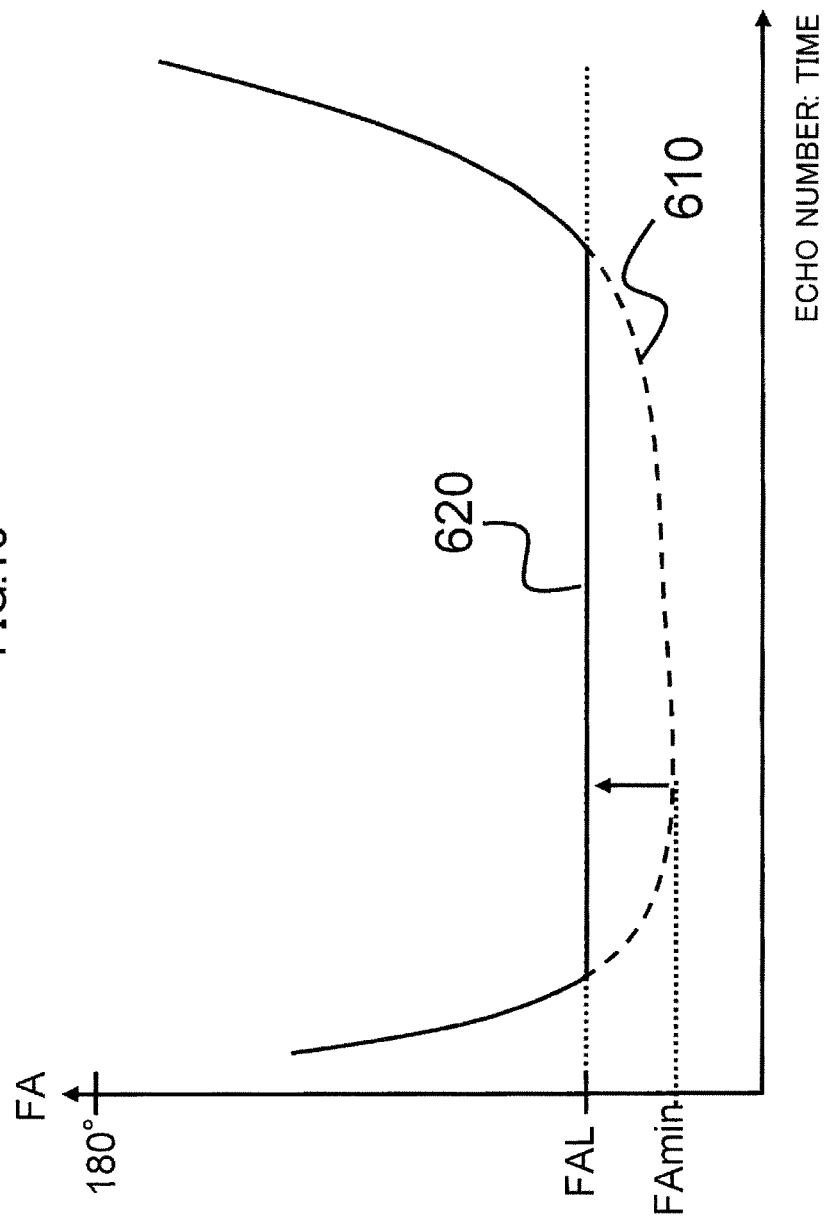
FIG. 13 is a view for explaining another example of the FA changing method in Embodiment 1.

Also, when the calcTEequiv is smaller than the inpuTEequiv (calcTEequiv<inputTEequiv), the post-conversion FAP 620 may also be acquired by changing all FAs having the some value as a predetermined minimum value (FAL) or smaller in the pre-change FAP 610 to be the FAL. The changing process of the above-described method is shown in FIG. 13.

Figure 14:
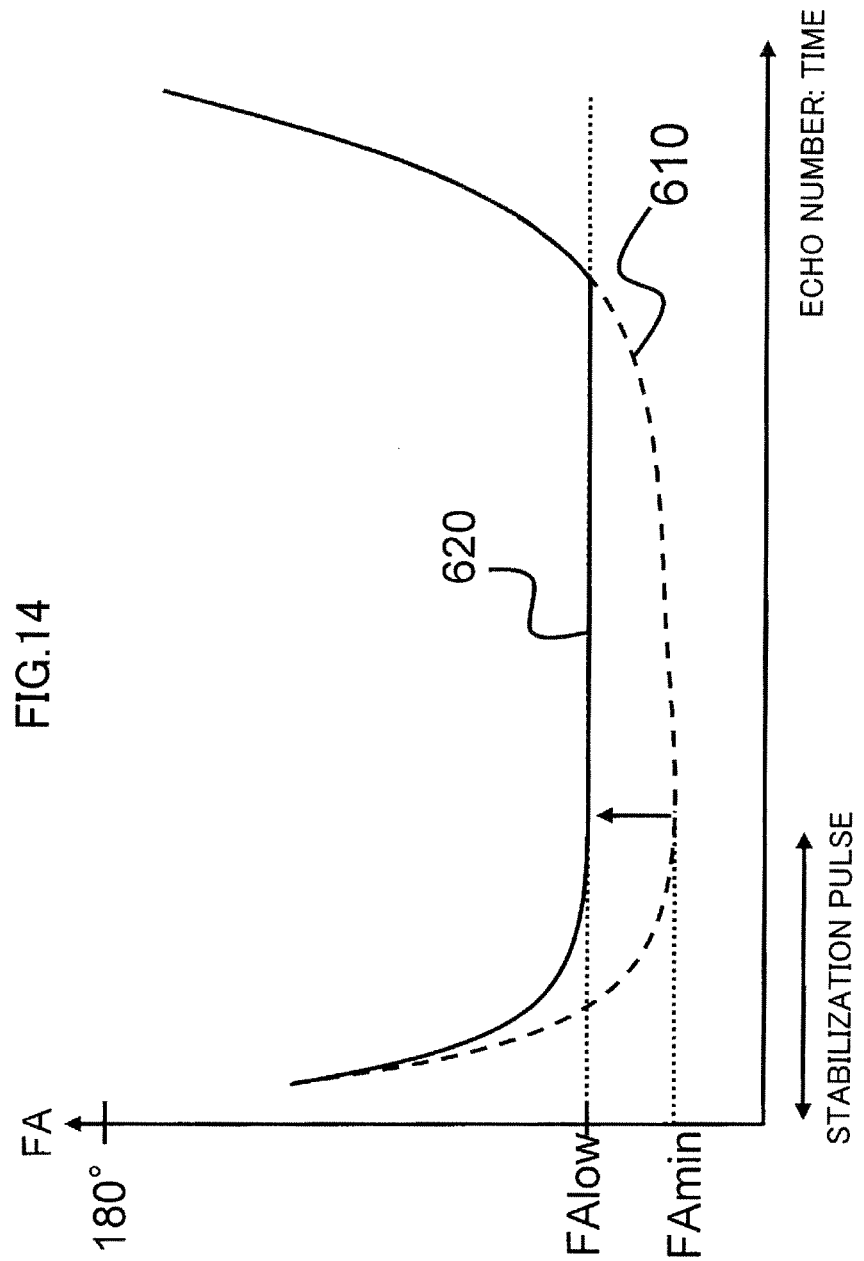
FIG. 14 is a view for explaining another example of the FA changing method in Embodiment 1.

In the same manner, when the calcTEequiv is smaller than the inpuTEequiv (calcTEequiv<inputTEequiv), the post-change FAP 620 may also be acquired by performing the similarity transformation or the stabilization-pulse pattern transformation while setting the above-mentioned FAmin as the FAL only on the stabilization pulse part of the pre-change FAP 610 and changing all FAs of the other refocus RE pulses having the same value as the FAL or smaller to be the FAL. The changing method in this case is shown in FIG. 14.

The same effect as the above-described embodiment can be achieved by using these changing methods.

As described above, the factor for determining the contrast is mainly the echo signal (acquired at the time of effective TE) to be arranged in the center of a k-space. Generally the echo signal to be acquired after an effective TE is arranged in the high-spatial frequency area of the k-space. Therefore, changing of the FA value after the effective TE has no effect on the calculated calcTEequiv.

For this reason, the changing process may also be configured to change only the FAs ranging from the first FA to the FA at the effective TE, using any of the above-described methods. In this manner, only the FAs related to the echo signals which determine the contrast of an image can be effectively adjusted, thereby reducing the processing amount while achieving the same effect as described above.

In addition, the range of FAs to be changed is not limited to the first FA to the FA at the effective TE. The first FA to the FA in an arbitrary range after the effective TE may also be changed. The FAs ranging from the first one to the FAs in an arbitrary range after the effective TE may also be changed. By adjusting the FAs up to the one which is related to the acquisition of the echo signal to be arranged in a high-spatial frequency area, the resolution of an image can be improved.

Also as described above, the FAs after the effective TE have no effect on the calcTEequiv. However, it exerts influence on the resolution or SNR of an image. Therefore, using such property, image quality may also be adjusted by changing the FAs after the effective TE. For example, the SNR can be improved by setting the FAs that are near the effective TE and of the refocus high-frequency magnetic field pulses which acquire the low-spatial frequency area in a k-space high. Also, the resolution of an image can be improved by changing the FAs to be gradually increased so as to suppress the signal decay.

Figure 15:
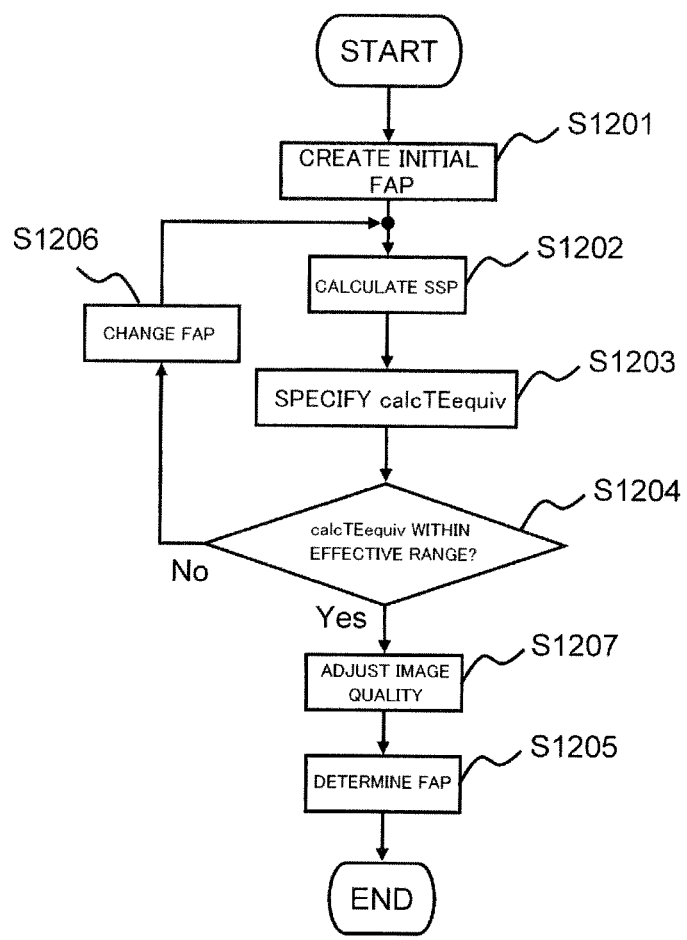
FIG. 15 is a flowchart of another example of the FA determining process in Embodiment 1.

The flow of the FA determining process in this case by the FA determining section 421 is shown in FIG. 15.

The procedure up to step 1206 of the FA determining process is the same as the FA determining process of the above-described embodiment.

After determining the FA using the above-described method, image quality is adjusted by adjusting the FAs after the effective TE (step S1207). Then the FAs after the adjustment are determined as the FA changing pattern (step S1205).

Embodiment 2

Next, Embodiment 2 to which the present invention is applied will be described. Embodiment 1 approximates the calcTEequiv to the inputTEequiv by changing the FA changing pattern, and determines the FA changing pattern for acquiring a desired TEequiv. In the present embodiment, the similar FA changing pattern is determined by changing the signal decay pattern. In the following description, the present embodiment will be described focusing mainly on the configuration which is different from Embodiment 1.

The MRI apparatus 100 in the present embodiment has basically the same configuration as that of Embodiment 1. The signal processing system 70 in the present embodiment comprises the receiving unit 410 and the sequence creating unit 420 as in Embodiment 1. The sequence creating unit 420 of the present embodiment also basically comprises the FA determining section 421 configured to determine an FA changing pattern FAP as in Embodiment 1. The processes in the receiving unit 410 and the sequence creating unit 420 are also basically the same as in Embodiment 1.

In the present embodiment, the processes in the receiving unit 410 and the sequence creating unit 420 are achieved via the CPU 71 of the signal processing system 70 by loading the previously stored program from the storage device 72 or the external storage device 73 to the memory and executing them.

The FA determining section 421 in the present embodiment determines the FA changing pattern FAP to make the TEequiv to be a desired TEequiv (inpuTEequiv), as in Embodiment 1. While the FA changing pattern itself is changed for approximating the calculated calcTEequiv to the inpuTEequiv which is specified by an operator in Embodiment 1 as described above, the signal decay pattern SSP is to be changed in the present embodiment.

That is, the FA determining section 421 in the present embodiment calculates the calcTEequiv each time that the signal decay pattern SSP is acquired, and repeats the changing of the signal decay pattern SSP using a predefined method in accordance with the comparison result with the inputTEequiv. The process is repeated until the calcTEequiv falls within the effective range of the inputTEequiv. Then the FA changing pattern FAP is determined from the determined signal decay pattern SSP using a known method such as the Prospective EPG which is disclosed in Non-patent Document 3.

The initial pattern of the signal decay pattern SSP is calculated from the initial value of the FA changing pattern FAP (initial FA changing pattern) to be determined by imaging conditions using the EPG method. Then the calculated signal decay pattern SSP is approximated by the approximate equation such as an exponent function.

In the present embodiment, an example of a case is described in which a double exponential function in the following equation (2) is used.

$$SSP(t)=(1-S0)\times \exp(-t/Ts)+S0\times \exp(-t/T12) \quad (2)$$

Here, S0 is the signal intensity which satisfies <S0<1, Ts is a time constant of a stabilization pulse and T12 is a time constant of a signal decay pattern SSP, which are set in advance respectively. These time constants satisfy Ts<T12. The elapsed time from the application of the 90° pulse 201 is indicated by t.

The initial pattern of the signal decay pattern SSP may also be determined by previously defining the approximate function and the coefficient thereof, not by approximating the signal decay pattern calculated from the initial FA changing pattern.

Next, the flow of the FA determining process by the FA determining section 421 in the present embodiment will be described. FIG. 16 is the processing flow of the FA determining section in the present embodiment.

The FA determining section 421 creates the initial FA changing FAP from the received imaging conditions (step S2101). Then the initial signal decay pattern SSP (initial SSP) is calculated from the initial FA changing pattern FAP using a method such as an EPG (step S2102). Then the FA determining section 421 specifies the calcTEequiv on the calculated signal decay pattern SSP (step S2103).

The FA determining section 421 determines whether or not the specified calcTEequiv falls within the effective range of the inputTEequiv (step S2104). Then if the calcTEequiv falls within the effective range, the FA determining section 421 determines the signal decay pattern SSP at that point as the signal decay pattern SSP for acquiring a desired contrast (step S2105), calculates an FA changing pattern FAP from the signal decay pattern SSP using a method such as the Prospective EPG (step S2106), and determines the calculated FAP as the FA changing pattern FAP for acquiring a desired contrast. The effective range is stored previously in a device such as the storage device 72 also in the present embodiment.

On the other hand, if the specified calcTEequiv is not in the effective range, the FA determining section 421 changes the signal decay pattern SSP using a previously defined method (SSP changing process: step S2107), proceeds to step S2103 and repeats the process.

In accordance with the above-described procedure, the FA determining section 421 determines the FA changing pattern capable of achieving a desired TEequiv (inputTEequiv).

Next, an SSP changing process by the FA determining section 421 in the present embodiment will be described which changes the signal decay pattern SSP in the above-described step S2107. In the SSP changing process, the FA determining section 421 changes the signal decay pattern SSP by controlling parameters of the approximate equation, so that the calcTEequiv falls within the effective range of the inputTEequiv. The FA determining section 421 compares the calcTEequiv and the inputTEequiv, and adjusts parameters in accordance with the comparison result.

The FA determining section 421 compares the calcT-Eequiv and the inputTEequive. When the calcTEequiv is smaller than the inputTEequiv (calcTEequiv< inputTEequiv), adjusts the parameters to make the signal decay pattern SSP steep. On the other hand, when the calcTEequiv is greater than the inputTEequiv (calcTEEquiv>inputTEequiv), the parameters are adjusted so that the change of the signal decay pattern SSP becomes gradual.

For example, when the approximation is performed by an exponent function in the above-described equation (2), in order to make the change of the signal decay pattern SSP gradual, for example the initial value S0 of the signal intensity is increased. Also, a time constant T12 of the signal decay pattern is increased. On the other hand, in order to make the change of the signal decay pattern steep, the initial value S0 of the signal intensity is to be decreased, or the time constant T12 is to be decreased.

As for the change of the initial value S0 and a time constant T12, one of them may be performed or both of them may be combined. Variation amounts ($\Delta$S0, $\Delta$T12) are to be determined in advance, and they may also be determined using a predetermined maximum value and the minimum value by a method such as the golden section method and bisection method.

The flow of the signal decay pattern SSP changing process in the present embodiment will be described referring to FIG. 17. As shown in the diagram, the FA determining section 421 starts the present process, when the calcTEequiv and the inputTEequiv are compared in the above-described step 2104 and the calcTEequiv is in the effective range.

The FA determining section 421 first compares the values of the calcTEequive and the inputTEequiv (step S2201). Then when the calcTEequiv is smaller than the inputTEequiv (calcTEequiv<inputTEequiv), the value of the S0 and/or T12 is increased by a predetermined variation ($\Delta$S0, NW) (step S2202). The signal decay pattern SSP which is expressed by the equation (2) is set as the post-change FA changing pattern using S0 or T12 after the change (step S2203).

On the other hand, when the calcTEequiv is greater than the inputTEequiv (calcTEequiv>inputTEequiv) in step S2201, the value of S0 and/or T12 is decreased by a predetermined variation (step S2203). Then in accordance with the above-described equation (2), the acquired signal decay pattern SSP is set as the post-signal decay pattern SSP (step S2204).

As described above, the present embodiment determines an FA changing pattern capable of achieving a desired contrast, i.e. the FAs of plural refocus RF pulses to be applied. An imaging is executed using the determined FA, thus an image with a desired contrast can be obtained.

The sequence creating unit 420 has been provided to the MRI apparatus 100 in the above-described respective embodiments, but the present invention is not limited thereto. For example, the sequence creating unit 420 may also be built in an information processing device which is capable of transmitting/receiving data to/from the MRI apparatus 100 and is separate from the MRI apparatus 100. The following is a summary of the MRI apparatus and the flip angle determining method in the present invention which has been described above in the respective embodiments.

The MRI in the present invention comprises:
static magnetic field generating unit configured to generate a static magnetic field;
gradient magnetic field application unit configured to apply a gradient magnetic field to an object to be examined that is placed in the static magnetic field;
high-frequency magnetic field application unit configured to apply a high-frequency field pulse for exciting magnetization of the object at a predetermined flip angle;
signal reception unit configured to receive an echo signal emitted from the object by nuclear magnetic resonance;
image reconstruction unit configured to reconstruct an image from the received echo signal;
control unit configured to control the gradient magnetic field application unit, high-frequency magnetic field application unit, signal reception unit and image reconstruction unit in accordance with an imaging sequence; and
receiving unit configured to receive input of imaging conditions to be used by the control unit,
wherein:
the imaging conditions include contrast information for specifying a desired contrast;
the control unit comprises sequence generating unit configured to generate an imaging sequence using the imaging condition and a pulse sequence;
the pulse sequence is for applying plural refocus high-frequency magnetic field pulse after applying one excitation high-frequency magnetic field pulse;

the sequence generation unit comprises flip-angle determination unit configured to determine each flip angle of the plural refocus high-frequency magnetic field pulses; and the flip angle determining unit searches flip angles capable of acquiring an image with a desired contrast which is specified by the contrast information by changing each flip angle of the plural refocus high-frequency magnetic field pulses, and determines the searched flip angles as each flip angle of the plural refocus high-frequency magnetic field pulses to be used in the imaging sequence.

Preferably, the flip angle determining means changes each flip angle of the plural refocus high-frequency magnetic field pulses so that a calculated echo time which determines, from the signal intensity of the echo signals acquired by each flip angle of the plural refocus high-frequency magnetic field pulses, the contrast of a reconstruction image obtained by the flip angles falls within the effective range of a desired echo time which determines the desired contrast.

Also preferably, the flip angle determining means compares the calculated echo time and the desired echo time, increases all flip angles of the plural refocus high-frequency magnetic field pulses with respect to the predetermined reference value at equal rate when the calculated echo time is shorter than a desired echo time, and decreases all flip angles of the plural refocus high-frequency magnetic field pulses with respect to the predetermined reference value at equal rate when the calculated echo time is longer than a desired echo time.

Also preferably, the flip angle determining means, as the result of comparison between the calculated echo time and the desired echo time, makes the change of flip angles of stabilization pulses in the plural refocus high-frequency magnetic field pulses gradual when the calculated echo time is shorter than the desired echo time, and makes the change of flip angles of stabilization pulses in the plural refocus high-frequency magnetic field pulses steep when the calculated echo time is shorter than the desired echo time.

Also preferably, when the calculated echo time and the desired echo time are compared and the calculated echo time is shorter than the desired echo time, the flip angle determining means sets all flip angles having the same value or less than a predetermined minimum value at the minimum value.

Also preferably, when the calculated echo time and the desired echo time are compared and the calculated echo time is shorter than the desired echo time, the flip angle determining means sets flip angles of stabilization pulses among the plural refocus high-frequency magnetic field pulses at a predetermined minimum value or greater by increasing the flip angles at equal rate with respect to a predetermined reference value or making the change thereof gradual, and sets the flip that are of the pulses other than the plural refocus high-frequency magnetic field pulses and have the same value as a predetermined minimum value or smaller at the minimum value.

Also preferably, the flip angle determining means changes only the flip angles in the time range from the first refocus high-frequency magnetic field pulse to a predetermined refocus high-frequency magnetic field pulse after the effective echo time from among the plural refocus high-frequency magnetic field pulses.

Also preferably, the flip angle determining means adjusts image quality using the refocus high-frequency pulses other than the changed refocus high-frequency pulses.

Also preferably, the flip angle determining means changes the respective flip angles of the plural refocus high-frequency magnetic field pulses by approximating the signal intensity of an echo train formed by the echo signals acquired by the respective flip angles of the plural refocus high-frequency magnetic field pulses by a predetermined function and changing parameters of the function so that a calculated echo time which determines a calculated contrast of a reconstruction image falls within the effective range of a desired echo time which determines the desired contrast.

Also preferably, the flip angle determining means changes the respective flip angles of the plural refocus high-frequency magnetic field pulses by approximating the signal intensity of the echo train by an exponent function and changing a proportional constant and/or a time constant for specifying the exponent function.

Also preferably, when the calculated echo time and the desired echo time are compared and the calculated echo time is shorter than the desired echo time, the flip angle determining means increases the proportional constant and/or time constant by a predetermined variation. When the calculated echo time is longer than the desired echo time, the proportional constant and/or the time constant are decreased by the variation.

Further, the flip angle determining method of the present invention to be executed in a magnetic resonance imaging apparatus determines, from among the pulse sequences for applying plural refocus high-frequency magnetic field pulses after application of one excitation high-frequency magnetic field pulse, each flip angle of the plural refocus high-frequency magnetic field pulses on the basis of imaging conditions wherein the imaging conditions include contrast information for specifying a desired contrast, comprising:

searching flip angles capable of obtaining an image with a desired contrast to be specified by the contrast information by changing the respective flip angles of the plural refocus high-frequency magnetic field pulses; and determining the flip angles acquired by the search as the respective flip angles of the plural refocus high-frequency magnetic field pulses.

Preferably, the searching the flip angle changes the respective flip angles of the plural refocus high-frequency magnetic field pulses so that a calculated echo time which determines the contrast in a reconstruction image which can be acquired by the flip angles from the signal intensity of the echo signal which can be acquired by the respective flip angles of the plural refocus high-frequency magnetic field pulses falls within the effective range of a desired echo time which determines the desired contrast.

BRIEF DESCRIPTION OF REFERENCE NUMERALS 10 object
20 static magnetic field generating system
30 gradient magnetic field generating system
31 gradient magnetic field coil
32 gradient magnetic field source
40 sequencer
50 transmitting system
51 transmitting coil
52 synthesizer
53 modulator
54 high-frequency amplifier
60 receiving system
61 receiving coil
62 signal amplifier 63 quadrature phase detector
64 A/D converter
70 signal processing system
71 CPU
72 storage device
73 external storage device
74 display device
75 input device
100 MRI apparatus
200 ESE pulse sequence
201 excitation pulse
202 refocus RE pulse
203 echo signal
310 signal decay curve
311 T2 decay curve
320 FA changing curve
410 receiving unit
420 sequence creating unit
421 FA determining section
500 UI screen
510 imaging condition input area
511 inputTEequiv input area
610 pre-change FAP
620 post-change FAP

The invention claimed is:

1. A magnetic resonance imaging apparatus comprising:
static magnetic field generating unit configured to generate a static magnetic field;
gradient magnetic field application unit configured to apply a gradient magnetic field to an object to be examined that is placed in the static magnetic field;
high-frequency magnetic field application unit configured to apply a high-frequency field magnetic pulse for exciting magnetization of the object at a predetermined flip angle;
signal receiving unit configured to receive echo signals emitted from the object by nuclear magnetic resonance;
image reconstruction unit configured to reconstruct an image from the received echo signal;
control unit configured to control the gradient magnetic field application unit, high-frequency magnetic field application unit, signal receiving unit and image reconstruction unit in accordance with an imaging sequence; and
input receiving unit configured to receive input of imaging conditions to be used by the control unit,
wherein:
the imaging conditions include contrast information for specifying a desired contrast;
the control unit comprises sequence generation unit configured to generate an imaging sequence using the imaging condition and a pulse sequence;
the pulse sequence is for applying plural refocus high-frequency magnetic field pulses after applying one excitation high-frequency magnetic field pulse;
the sequence generation unit comprises flip-angle determination unit configured to determine each flip angle of the plural refocus high-frequency magnetic field pulses; and
the flip angle determination unit searches flip angles capable of acquiring an image with a desired contrast which is specified by the contrast information by changing each flip angle of the plural refocus high-frequency magnetic field pulses, and determines the acquired flip angles as the respective flip angles of the plural refocus high-frequency magnetic field pulses to be used in the imaging sequence, and
wherein the flip angle determining unit changes each flip angle of the plural refocus high-frequency magnetic field pulses so that a calculated echo time which determines the contrast of a reconstruction image which can be obtained by the flip angles from the signal intensity of echo signals which can be acquired by the respective flip angles of the plural refocus high-frequency magnetic field pulses falls within the effective range of a desired echo time which determines the desired contrast
wherein the flip angle determining unit, as the result of comparing the calculated echo time and the desired echo time, makes the change of flip angles of stabilization pulses among the plural refocus high-frequency magnetic field pulses gradual when the calculated echo time is shorter than the desired echo time, and makes the change of flip angles of the stabilization pulses steep when the calculated echo time is longer than the desired echo time.

2. The magnetic resonance imaging apparatus according to claim 1, wherein the flip angle determining unit compares the calculated echo time and the desired echo time, increases all flip angles of the plural refocus high-frequency magnetic field pulses with respect to a predetermined reference value at equal rate when the calculated echo time is shorter than the desired echo time, and all flip angle of the plural refocus high-frequency magnetic field pulses are reduced with respect to a predetermined reference value at equal rate when the calculated echo time is longer than the desired echo time.

3. A magnetic resonance imaging apparatus comprising:
static magnetic field generating unit configured to generate a static magnetic field;
gradient magnetic field application unit configured to apply a gradient magnetic field to an object to be examined that is placed in the static magnetic field;
high-frequency magnetic field application unit configured to apply a high-frequency field magnetic pulse for exciting magnetization of the object at a predetermined flip angle;
signal receiving unit configured to receive echo signals emitted from the object by nuclear magnetic resonance;
image reconstruction unit configured to reconstruct an image from the received echo signal;
control unit configured to control the gradient magnetic field application unit, high-frequency magnetic field application unit, signal receiving unit and image reconstruction unit in accordance with an imaging sequence; and
input receiving unit configured to receive input of imaging conditions to be used by the control unit,
wherein:
the imaging conditions include contrast information for specifying a desired contrast;
the control unit comprises sequence generation unit configured to generate an imaging sequence using the imaging condition and a pulse sequence;
the pulse sequence is for applying plural refocus high-frequency magnetic field pulses after applying one excitation high-frequency magnetic field pulse;
the sequence generation unit comprises flip-angle determination unit configured to determine each flip angle of the plural refocus high-frequency magnetic field pulses; and
the flip angle determination unit searches flip angles capable of acquiring an image with a desired contrast which is specified by the contrast information by changing each flip angle of the plural refocus high-frequency magnetic field pulses, and determines the acquired flip angles as the respective flip angles of the plural refocus high-frequency magnetic field pulses to be used in the imaging sequence, and wherein the flip angle determining unit changes each flip angle of the plural refocus high-frequency magnetic field pulses so that a calculated echo time which determines the contrast of a reconstruction image which can be obtained by the flip angles from the signal intensity of echo signals which can be acquired by the respective flip angles of the plural refocus high-frequency magnetic field pulses falls within the effective range of a desired echo time which determines the desired contrast wherein the flip angle determining unit, when the calculated echo time and the desired echo time are compared and the calculated echo time is shorter than the desired echo time, sets all flip angles having the same value as a predetermined minimum value or smaller at the minimum value.

4. A magnetic resonance imaging apparatus comprising:

static magnetic field generating unit configured to generate a static magnetic field;

gradient magnetic field application unit configured to apply a gradient magnetic field to an object to be examined that is placed in the static magnetic field;

high-frequency magnetic field application unit configured to apply a high-frequency field magnetic pulse for exciting magnetization of the object at a predetermined flip angle;

signal receiving unit configured to receive echo signals emitted from the object by nuclear magnetic resonance;

image reconstruction unit configured to reconstruct an image from the received echo signal;

control unit configured to control the gradient magnetic field application unit, high-frequency magnetic field application unit, signal receiving unit and image reconstruction unit in accordance with an imaging sequence, and input receiving unit configured to receive input of imaging conditions to be used by the control unit, wherein:

the imaging conditions include contrast information for specifying a desired contrast;

the control unit comprises sequence generation unit configured to generate an imaging sequence using the imaging condition and a pulse sequence;

the pulse sequence is for applying plural refocus high-frequency magnetic field pulses after applying one excitation high-frequency magnetic field pulse;

the sequence generation unit comprises flip-angle determination unit configured to determine each flip angle of the plural refocus high-frequency magnetic field pulses; and the flip angle determination unit searches flip angles capable of acquiring an image with a desired contrast which is specified by the contrast information by changing each flip angle of the plural refocus high-frequency magnetic field pulses, and determines the acquired flip angles as the respective flip angles of the plural refocus high-frequency magnetic field pulses to be used in the imaging sequence, and wherein the flip angle determining unit changes each flip angle of the plural refocus high-frequency magnetic field pulses so that a calculated echo time which determines the contrast of a reconstruction image which can be obtained by the flip angles from the signal intensity of echo signals which can be acquired by the respective flip angles of the plural refocus high-frequency magnetic field pulses falls within the effective range of a desired echo time which determines the desired contrast, and wherein the flip angle determining unit, when the calculated echo time and the desired echo time are compared and the calculated echo time is shorter than the desired echo time, sets flip angles of stabilization pulses among the plural refocus high-frequency magnetic field pulses at a predetermined minimum value or greater by increasing the flip angles at equal rate with respect to a predetermined reference value or making the change thereof gradual, and sets the flip that are of the pulses other than the plural refocus high-frequency magnetic field pulses and have the same value as a predetermined minimum value or smaller at the minimum value.

5. A magnetic resonance imaging apparatus comprising:

static magnetic field generating unit configured to generate a static magnetic field;

gradient magnetic field application unit configured to apply a gradient magnetic field to an object to be examined that is placed in the static magnetic field;

high-frequency magnetic field application unit configured to apply a high-frequency field magnetic pulse for exciting magnetization of the object at a predetermined flip angle;

signal receiving unit configured to receive echo signals emitted from the object by nuclear magnetic resonance;

image reconstruction unit configured to reconstruct an image from the received echo signal;

control unit configured to control the gradient magnetic field application unit, high-frequency magnetic field application unit, signal receiving unit and image reconstruction unit in accordance with an imaging sequence; and input receiving unit configured to receive input of imaging conditions to be used by the control unit, wherein:

the imaging conditions include contrast information for specifying a desired contrast;

the control unit comprises sequence generation unit configured to generate an imaging sequence using the imaging condition and a pulse sequence;

the pulse sequence is for applying plural refocus high-frequency magnetic field pulses after applying one excitation high-frequency magnetic field pulse;

the sequence generation unit comprises flip-angle determination unit configured to determine each flip angle of the plural refocus high-frequency magnetic field pulses; and the flip angle determination unit searches flip angles capable of acquiring an image with a desired contrast which is specified by the contrast information by changing each flip angle of the plural refocus high-frequency magnetic field pulses, and determines the acquired flip angles as the respective flip angles of the plural refocus high-frequency magnetic field pulses to be used in the imaging sequence, and wherein the flip angle determining unit changes each flip angle of the plural refocus high-frequency magnetic field pulses so that a calculated echo time which determines the contrast of a reconstruction image which can be obtained by the flip angles from the signal intensity of echo signals which can be acquired by the respective flip angles of the plural refocus high-frequency magnetic field pulses falls within the effective range of a desired echo time which determines the desired contrast, and wherein the flip angle determining unit changes only flip angles in the range from the first refocus high-frequency magnetic field pulse to a predetermined refocus high-frequency magnetic field pulse after an effective echo time among the plural refocus high-frequency magnetic field pulses.

6. The magnetic resonance imaging apparatus according to claim 5, wherein the flip angle determining unit adjusts image quality using refocus high-frequency magnetic field pulses other than the changed refocus high-frequency magnetic field pulses.

7. A flip angle determining method to be executed in a magnetic resonance imaging apparatus which determines, among a pulse sequence which applies plural refocus high-frequency magnetic field pulses after application of one excitation high-frequency magnetic field pulse, each flip angle of the plural refocus high-frequency magnetic field pulses on the basis of imaging conditions, wherein the imaging conditions include contrast information that specifies a desired contrast, the flip angle determining method comprising:

searching flip angles capable of obtaining an image with a desired contrast to be specified by the contrast information by changing the respective flip angles of the plural high-frequency magnetic field pulses; and determining the flip angles acquired by the search as the respective flip angles of the plural refocus high-frequency magnetic field pulses, wherein the searching the flip angles changes the respective flip angles of the plural refocus high-frequency magnetic field pulses so that a calculated echo time which determines the contrast of a reconstruction image obtained by the flip angles from the signal intensity of echo signals acquired by the flip angles of the plural refocus high-frequency magnetic field pulses falls within the effective range of a desired echo time which determines the desired contrast, and comparing the calculated echo time and the desired echo time, and when the calculated echo time is shorter than the desired echo time, making the change of flip angles of stabilization pulses among the plural refocus high-frequency magnetic field pulses gradual, and when the calculated echo time is longer than the desired echo time, making the change of flip angles of the stabilization pulses steep.

* * * * *